United States Patent
Stone et al.

(10) Patent No.: US 9,990,837 B1
(45) Date of Patent: Jun. 5, 2018

(54) INTRINSIC SAFETY ISOLATION WITH CAPACITIVE COUPLING

(71) Applicant: Rosemount Inc., Shakopee, MN (US)

(72) Inventors: Andrew L. Stone, Bloomington, MN (US); John A Kielb, Eden Prairie, MN (US)

(73) Assignee: Rosemount Inc., Shakopee, MN (US)

( * ) Notice: Subject to any disclaimer, the term of this patent is extended or adjusted under 35 U.S.C. 154(b) by 0 days. days.

(21) Appl. No.: 15/446,459

(22) Filed: Mar. 1, 2017

(51) Int. Cl.
*G08B 25/10* (2006.01)
*H03C 3/42* (2006.01)

(52) U.S. Cl.
CPC .............. *G08B 25/10* (2013.01); *H03C 3/42* (2013.01)

(58) Field of Classification Search
CPC .................................. G08B 25/10; H03C 3/42
See application file for complete search history.

(56) References Cited

U.S. PATENT DOCUMENTS

| | | | |
|---|---|---|---|
| 2003/0091183 A1* | 5/2003 | Holcombe | H04B 14/026 379/399.01 |
| 2009/0253388 A1 | 10/2009 | Kielb et al. | |
| 2010/0101081 A1* | 4/2010 | Kim | H01L 21/6835 29/832 |
| 2012/0049834 A1* | 3/2012 | Pommerenke | H02M 1/34 323/311 |
| 2013/0043792 A1* | 2/2013 | Reed | H05B 33/0887 315/126 |
| 2015/0083942 A1 | 3/2015 | Hunter et al. | |
| 2015/0326153 A1* | 11/2015 | Gohara | H02P 6/002 318/400.2 |

\* cited by examiner

*Primary Examiner* — Leon Flores
(74) *Attorney, Agent, or Firm* — Christopher R. Christenson; Kelly, Holt & Christenson, PLLC (57) ABSTRACT

A communication apparatus is provided. The apparatus includes a printed circuit board having a thickness that complies with an intrinsic safety physical separation specification. A first pair of capacitive plates are disposed on opposite sides of the printed circuit board and are arranged to form a first capacitor having an insulating layer of the printed circuit board forming a dielectric material for the first capacitor. A second pair of capacitive plates are disposed on opposite sides of the printed circuit board and are arranged to form a second capacitor having the insulating layer of the printed circuit board forming a dielectric material for the second capacitor. A modulator is coupled to the first and second capacitors and is configured to receive an input signal having an input signal frequency and to provide a modulated signal having a frequency that is higher than the input signal. A demodulator is coupled to the first and second capacitors and configured to detect the modulated signal and provide a demodulated signal having the input signal frequency.

16 Claims, 9 Drawing Sheets

INTRINSIC SAFETY ISOLATION WITH CAPACITIVE COUPLING

BACKGROUND

In industrial settings, control systems are used to monitor and control inventories of industrial and chemical processes, and the like. Typically, the control system performs these functions using field devices distributed at key locations in the industrial process and coupled to the control circuitry in the control room by a process control loop. The term "field device" refers to any device that performs a function in a distributed control or process monitoring system, including all devices currently known, or yet to be known, used in the measurement, control and monitoring of industrial processes. Usually, such field devices have a field-hardened enclosure so that they can be installed outdoors in relatively rugged environments and be able to withstand climatological extremes of temperature, humidity, vibration, and mechanical shock. Field devices typically operate on relatively low power. For example, some field devices are currently available that receive all of their operating power from a known 4-20 mA loop operating at relatively low voltages (12-42 VDC).

Some field devices include a transducer. A transducer is understood to mean either a device that generates an output signal based on a physical input or that generates a physical output based on an input signal. Typically, a transducer transforms an input into an output having a different form. Types of transducers include various analytical equipment, pressure sensors, thermistors, thermocouples, strain gauges, flow transmitters, positioners, actuators, solenoids, indicator lights, and others.

Typically, each field device also includes communication circuitry that is used for communicating with a process control room over the process control loop. In some installations, the process control loop is also used to deliver a regulated current and/or voltage to the field device for powering the field device. The process control loop also carries data, either in an analog or digital form.

Traditionally, analog field devices have been connected to the control room by two-wire process control current loops, with each device connected to the control by a single two-wire control loop. A voltage differential is maintained between the two wires within a range of voltages from 12-45 volts for analog and 9-50 volts for digital mode. Some analog field devices transmit a signal to the control room by modulating the current running through the current loop to a current proportional to the sensed process variable. Other analog field devices can perform an action under the control of the control room based on the magnitude of the current through the loop set by the control room. In addition, or in the alternative, the process control loop can carry digital signals for communication with field devices.

The environment within which the field devices operate are often made hazardous by the presence of flammable or combustible materials. In these areas, a spark or high surface temperature of a component could cause local atmosphere to ignite and propagate an explosion. These areas are referred to as Hazardous (Classified) areas. As a method of preventing unwanted ignitions, intrinsic safety specifications have been developed as a means of ensuring limited energy and temperature in field devices. Compliance with an intrinsic safety requirement helps ensure that even under fault conditions, the circuitry or device itself cannot itself ignite a volatile environment. One example of an intrinsic safety requirement is set forth in: APPROVAL STANDARD INTRINSICALLY SAFE APPARATUS AND ASSOCIATED APPARATUS FOR USE IN CLASS I, II AND III DIVISION 1 HAZARDOUS (CLASSIFIED) LOCATIONS, CLASS 3610, promulgated by Factory Mutual Research, October, 1988. Additional or alternate approvals are also set forth in industrial standards such as Canadian Standards Association (CSA) and the European Cenelec Standards.

One technique that can be used to comply with intrinsic safety standards is to separate components with a physical barrier. The amount of separation is dependent on the specific material used to form the physical barrier, and the voltage that the barrier must withstand. Optical isolators are known to be used for transmitting data across the barrier if they are separated in accordance with intrinsic safety standards.

An optical isolator, also known as an optoisolator or optocoupler, is an electrical arrangement that transfers electrical signals between two isolated circuits using different frequencies of the electromagnetic spectrum. The isolation between circuits prevents large voltages or current induced or otherwise present in one of the circuits from being transferred or coupled to the other circuit. Typically, optoisolators cannot transfer measurable power between the circuits, but can convey signals between the isolated circuits.

SUMMARY

A communication apparatus is provided. The apparatus includes a printed circuit board having a thickness that complies with an intrinsic safety physical separation specification. A first pair of capacitive plates are disposed on opposite sides of the printed circuit board and are arranged to form a first capacitor having an insulating layer of the printed circuit board forming a dielectric material for the first capacitor. A second pair of capacitive plates are disposed on opposite sides of the printed circuit board and are arranged to form a second capacitor having the insulating layer of the printed circuit board forming a dielectric material for the second capacitor. A modulator is coupled to the first and second capacitors and is configured to receive an input signal having an input signal frequency and to provide a modulated signal having a frequency that is higher than the input signal. A demodulator is coupled to the first and second capacitors and configured to detect the modulated signal and provide a demodulated signal having the input signal frequency.

DETAILED DESCRIPTION OF ILLUSTRATIVE EMBODIMENTS

In many electronic products, including the various field devices described above, optocouplers are used to provide communications that are able to meet intrinsic safety requirements for operation in sensitive environments. These optocouplers are used because they are generally one of two products on the market that are able to meet intrinsic safety requirements. Transformers (one type of product) could also be used to provide the intrinsically-safe galvanic isolation but are generally considered to be space and cost prohibitive. Optocouplers or optoisolators, on the other hand, use a light emitting diode that is electrically and physically isolated from the photo transistor that detects the light. The two parts are spaced from each other in order to meet the intrinsic safety spacing requirement and transfer a signal across the space by using a light.

Figure 1:
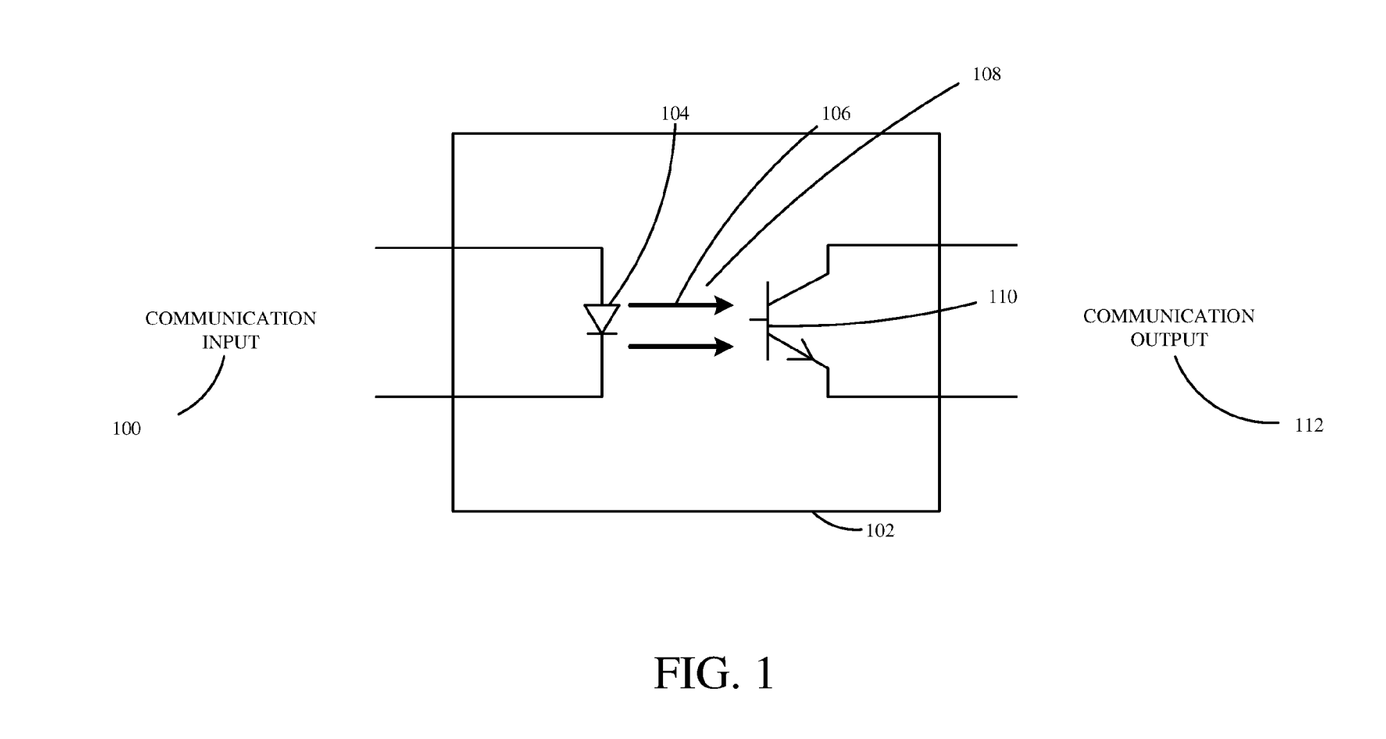
FIG. 1 is a diagrammatic view of an optoisolator used for facilitating communication in accordance with intrinsic safety requirements in accordance with the prior art.

FIG. 1 is a diagrammatic view of an optoisolator used for facilitating communication in accordance with intrinsic safety requirements in accordance with the prior art. Generally, a communication input signal 100 is provided as an input to optocoupler 102. This input signal causes light emitting diode 104 to generate light 106. Light 106 transfers or otherwise travels across physical space 108 and is detected by photo transistor 110. The signal from photo transistor 110 is substantially related to, although typically inverted, the communication input. Accordingly, the signal from photo transistor 110 is provided as communication output 112. In this way, a communication signal can be conveyed across isolation gap 108 in order to comply with intrinsic safety requirements, or otherwise provide desired isolation. As can be appreciated, if there is an electrical issue with the circuit providing the communication input, such as a DC offset, power surge, or other concern, such circuit condition will not be transferred to the output circuit. Instead, the communication signal itself will cross space 108, but an appreciable amount of electrical energy will not.

While optocouplers have provided low cost, relatively efficient communication of signals while facilitating intrinsic safety compliance, they are not without their limitations. Through aging, environmental conditions, and packaging issues, optocouplers can degrade to a point where they no longer work. For example, the gel encasing the light emitting diode 104 and photo transistor 110 becomes less transparent as the optocoupler ages. Once the gel becomes sufficiently opaque, the amount of light that the photo transistor receives may become reduced to the point where the output signal is degraded enough to cause communication failures.

In accordance with embodiments of the present invention, intrinsic safety requirements for electrically isolated communication circuits are met by providing a circuit that capacitively couples the communication signals through a printed circuit board. This capacitive coupling through the printed circuit board is provided by creating a capacitor on two layers on the printed circuit board using conductive pads (formed, in one embodiment, of copper) as the capacitor plates. The intrinsic safety spacing requirement is met by utilizing the hard insulation in the printed circuit board as the capacitor's dielectric material while maintaining required intrinsic safety spacing (0.5 mm for 60 volt peak level of protection category) spacing between the copper pads. The capacitor that is formed has a relatively low capacitance value. The signals used to communicate between isolated circuits in modern field devices may be relatively low in frequency, such as 28 kHz. In order to transfer the low-frequency communication signal across the relatively low-value printed circuit board-based capacitor, the input signal is modulated to a higher frequency signal. Using the higher frequency signal increases the energy that is coupled through the low-capacitance printed circuit board-based capacitor.

Figure 2:
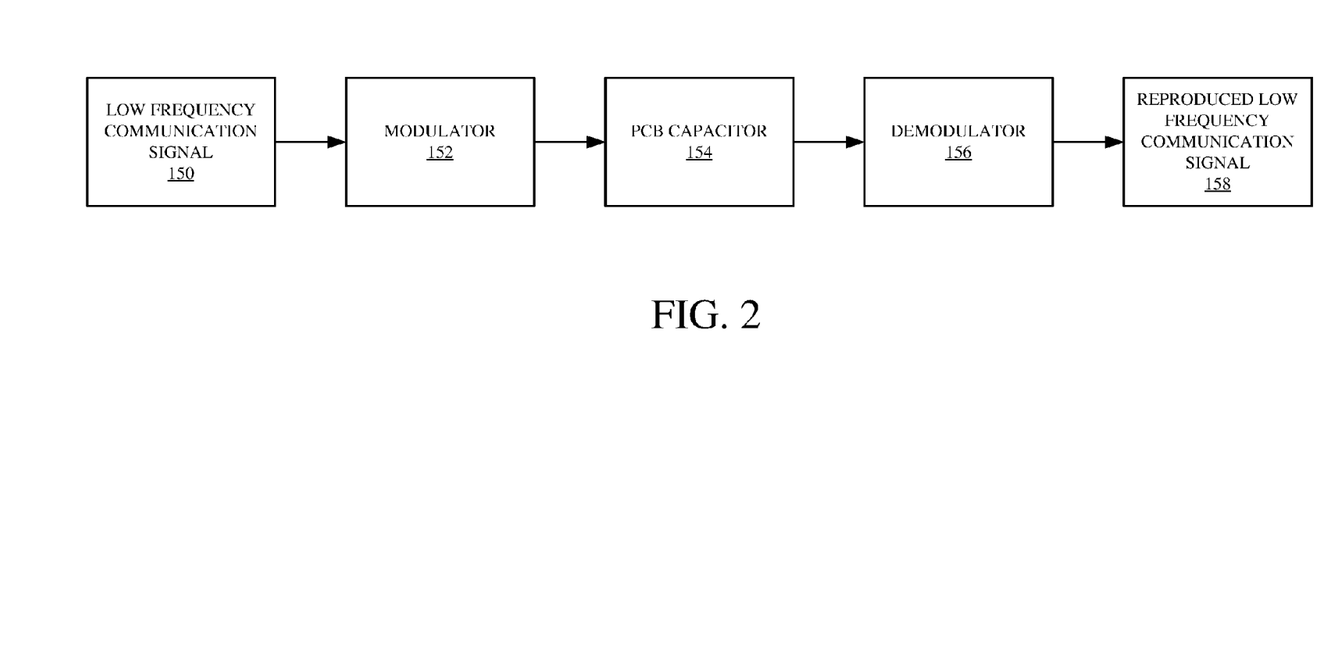
FIG. 2 is a block diagram of circuit components that are used to convey electrical signals across a physical barrier using capacitive coupling in accordance with an embodiment of the present invention.

FIG. 2 is a diagrammatic view of blocks of circuitry for providing capacitively coupled communications that comply with intrinsic safety requirements in accordance with an embodiment of the present invention. Initially, a relatively low-frequency communication signal, such as a signal having a frequency of 28 kHz, is provided at block 150. The signal is then conveyed to a modulator 152 that generates a higher-frequency signal. In some embodiments, modulator 152 is provided in the form of a multi-vibrator circuit. However, those skilled in the art will appreciate that any circuit arrangement that is able to receive an input signal and generate a correspondingly higher-frequency signal in order to modulate said input signal can be used. The modulated higher-frequency signal is then provided to a printed circuit board-based capacitor 154. As will be described in greater detail below with respect to FIGS. 6A and 6B, this printed circuit board capacitor generally is provided in the form of a pair of copper pads disposed on opposite sides of a printed circuit board and arranged such that the insulation material of the printed circuit board functions as a dielectric material for the capacitor. Once the signal crosses the printed circuit board capacitor, it is provided to demodulator circuit 156 that demodulates the signal and amplifies it. Finally, the reproduced low-frequency signal is provided from demodulator 156 as indicated at block 158. Each of the blocks shown in FIG. 2 will be described in greater detail below.

Low-frequency communication signal 150 is generally a communication signal used by modern field devices. One example of such a field device is a temperature transmitter that uses low-frequency communications to communicate between two electrically isolated intrinsically safe isolated circuits. As set forth above, the frequency of the signal is generally on the order of 28 kHz. However, those skilled in the art will appreciate that variations in frequency of the low-frequency signal as well as the suitable modulation to cross the printed circuit board capacitor can be provided in accordance with embodiments of the present invention.

Figure 3:
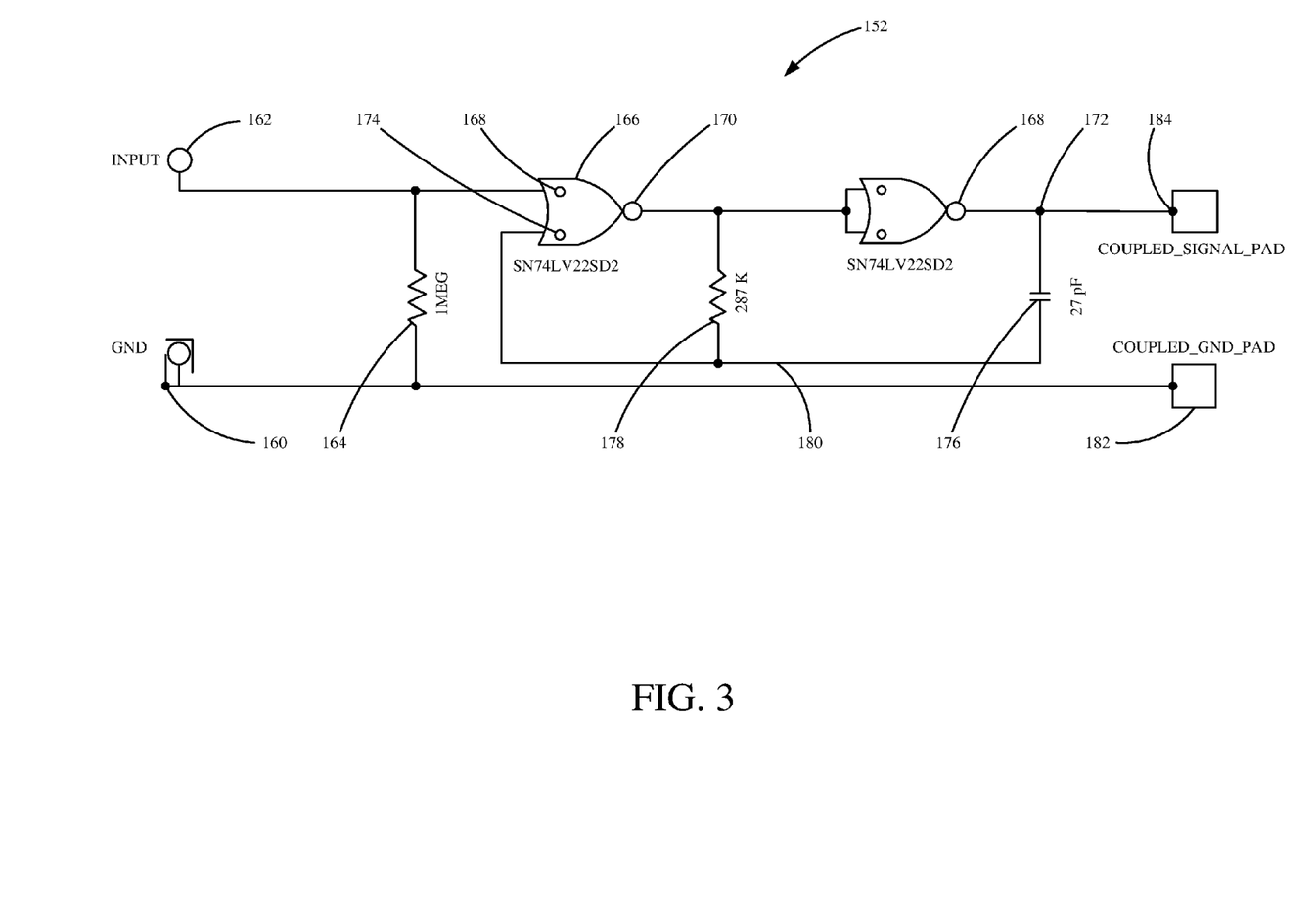
FIG. 3 is a circuit diagram of one exemplary astable multi-vibrator that can be used to modulate a low frequency communication signal for coupling across a capacitor in accordance with an embodiment of the present invention.

Modulator 152 is a circuit arrangement that is configured to receive low-frequency communication signal 150 and provide an associated higher-frequency signal. In one embodiment, the low-frequency communication signal 150 is modulated using an astable multi-vibrator. FIG. 3 is a circuit diagram of one exemplary astable multi-vibrator that can be used to increase the energy transfer across the low-capacitance printed circuit board-based capacitor. In one embodiment, the astable multi-vibrator only oscillates when the communication signal is low. This is because the communication signal is held high when no communications are occurring, and in order to preserve power, it is preferred that the multi-vibrator be idle when no communications are occurring. In one embodiment, the modulation is targeted to be approximately 15-20 times the frequency of the low-frequency communication signal. This provides a reasonable trade-off between the amount of energy coupled across the low-value printed circuit board-based capacitor and the power consumed by the astable multi-vibrator. As shown in FIG. 3, the low-frequency communication signal 150 is provided across ground terminal 160 and input signal terminal 162. A large resistance resistor 164 is coupled across input terminal 162 and ground terminal 160. In one embodiment, large resistance resistor 164 has a resistance on the order of 1 MΩ. As shown in FIG. 3, the astable multi-vibrator is generated using a pair of NOR gates 166, 168. Signal line 162 is coupled to first input 168 of NOR gate 166 which has its output 170 coupled to both inputs of NOR gate 168. The output 172 of NOR gate 168 is fed back to second input 174 of first NOR gate 166 through capacitor 176. In one embodiment, capacitor 176 has a value of 27 pF. Additionally, a resistor 178 couples output 170 to feedback line 180. In one embodiment, resistor 178 has a resistance of approximately 287 kΩ. By selecting the values for resistor 178 and capacitor 176, suitable oscillation of the astable multi-vibrator can be selected. As set forth above, in one embodiment, a modulator is selected to provide a frequency that is 15-20 times the frequency of the input signal. Additionally, as shown in FIG. 3, ground terminal 160 is coupled to ground pad 182 on the printed circuit board while output 172 is coupled to signal pad 184 on the printed circuit board. As will be described in greater detail below, the pads on the printed circuit board form capacitors that couple the modulated communication signal in accordance with an embodiment of the present invention.

Figure 4:
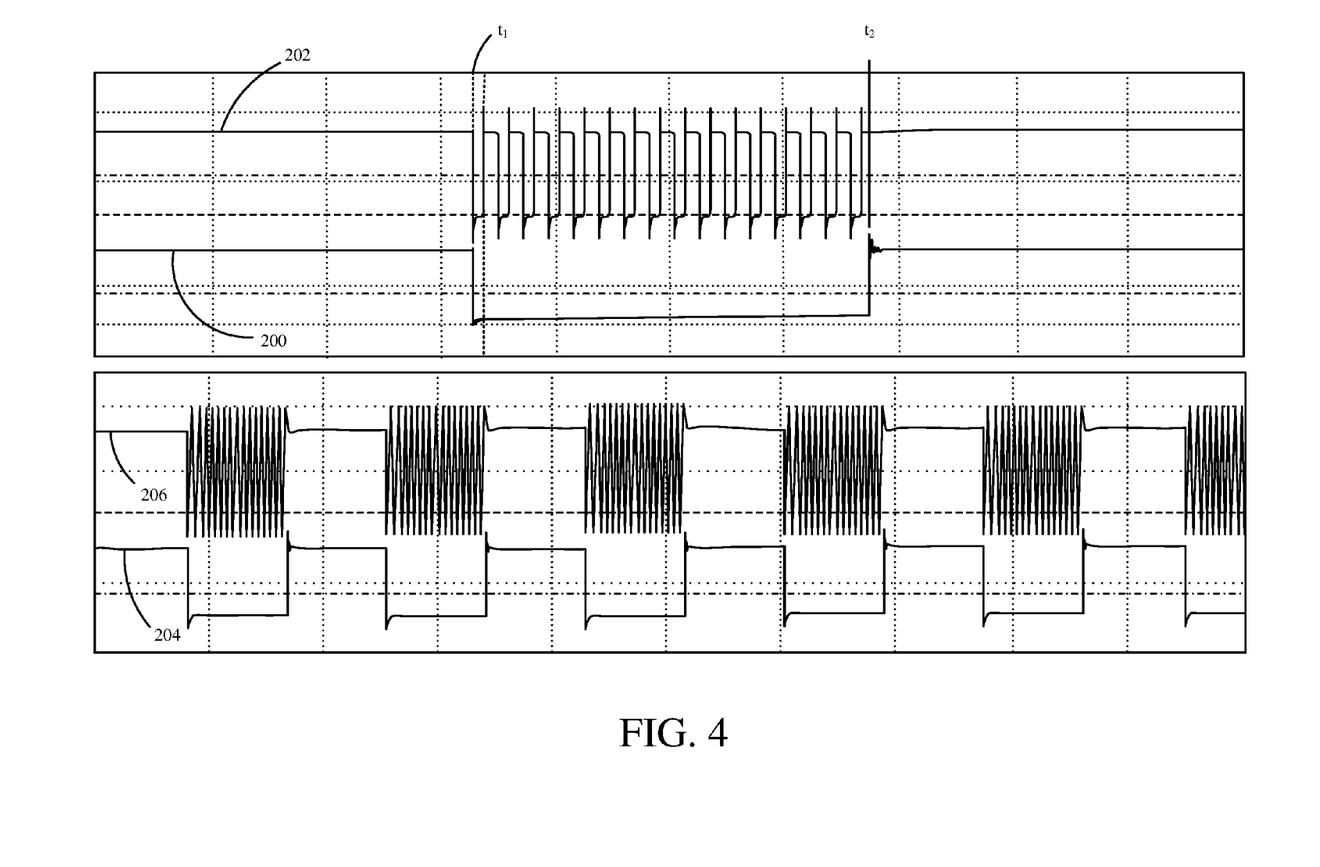
FIG. 4 is a timing diagram showing a communication signal and modulator output in accordance with an embodiment of the present invention.

FIG. 4 is a timing diagram showing the communication signal and the modulator output at various times. As shown at line 200, a low-frequency communication signal transitions from a high state to a low state at time $t_1$. The low-frequency communication signal remains in the low state until time $t_2$ when it returns to the high state. This frequency between transitions from low to high in the low-frequency communication signal may be on the order of a 28 kHz signal. As set forth above, this frequency may be far too low to be effectively coupled across a printed circuit board-based capacitor that complies with intrinsic safety spacing requirements in accordance with embodiments of the present invention. Accordingly, the modulator 152 is used to generate a high-frequency signal that will effectively transition or be coupled across a printed circuit board-based capacitor. As shown in FIG. 4, at time $t_1$ when low-frequency communication signal 200 transitions to a low state, multi-vibrator output 202 begins oscillating between low and high states. As can be seen, in the period between times $t_1$ and $t_2$, the multi-vibrator output transitions between high and low approximately 32 times. This provides a signal with high enough frequency to be effectively passed across the printed circuit board-based capacitors. FIG. 4 also shows another scenario in which the modulation can be seen turning on and off with low/high input. Again, for each instance where the low-frequency communication signal 204 transitions to a low state, astable multi-vibrator output 206 will begin oscillating between high and low states and remain in such an oscillatory state until the low-frequency communication signal returns to its high state. In this way, the astable multi-vibrator only vibrates when the communication input signal is low. This is due to the low-frequency communication signal being held high when no communications are occurring, thereby conserving power in the multi-vibrator.

Figure 5:
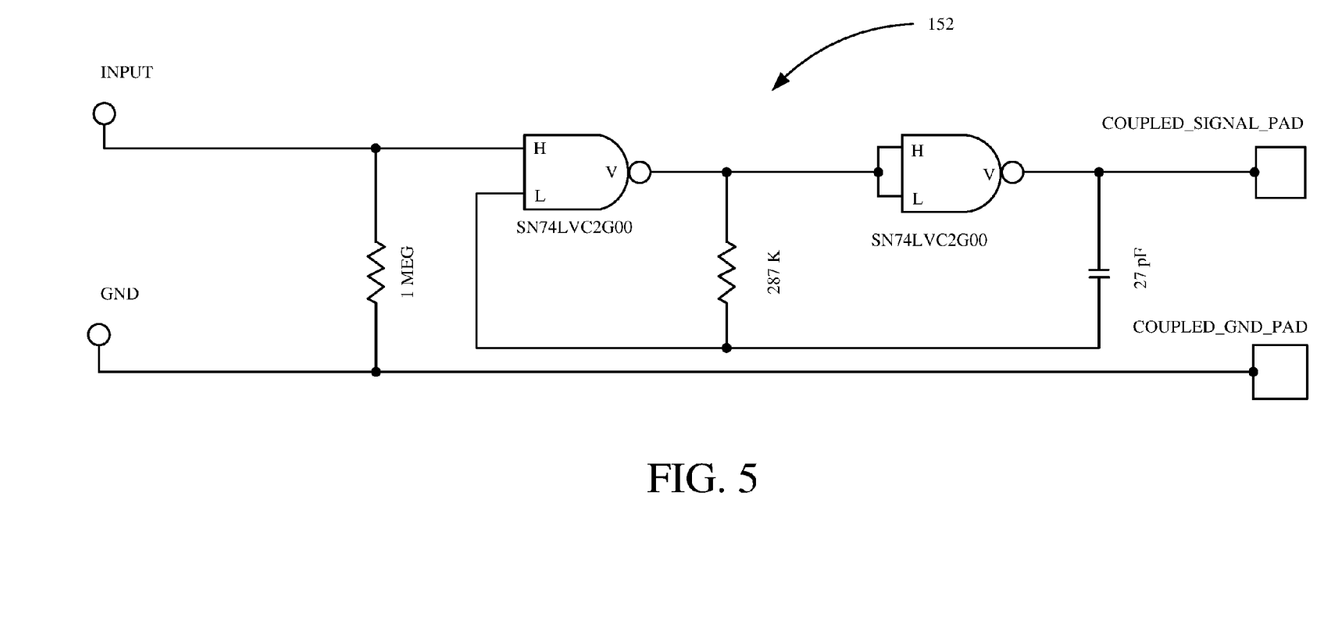
FIG. 5 is a circuit diagram of an alternate astable multi-vibrator circuit that can be used to modulate low frequency communication signals for coupling across a capacitor in accordance with an embodiment of the present invention.

As set forth above, the modulator can be provided in any suitable circuitry. FIG. 5 is a circuit diagram of an astable multi-vibrator that is formed using a NAND modulator circuit. In this multi-vibrator, oscillation only occurs when the communications input signal is held high. This design may be optimal or more efficient for an input communication circuit that is held low when no communications are occurring. As can be seen, circuit 152 is similar to the circuit shown in FIG. 3 with the exception that the NOR gates of FIG. 3 are replaced with NAND gates.

Figure 6A:
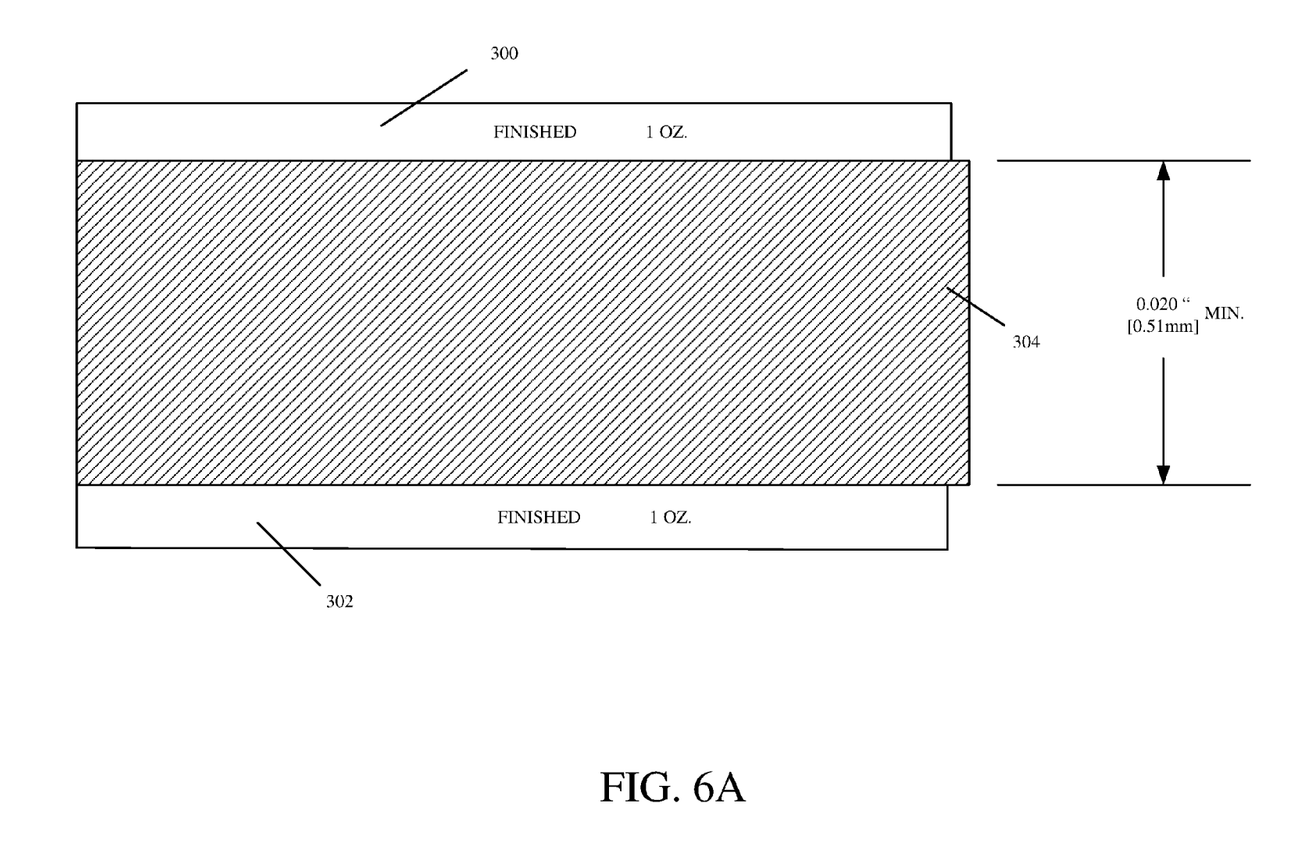
FIG. 6A is a cross-sectional view of a portion of a circuit board illustrating copper pads separated by insulating circuit board material used as a dielectric for a capacitor plate in accordance with an embodiment of the present invention.
Figure 6B:
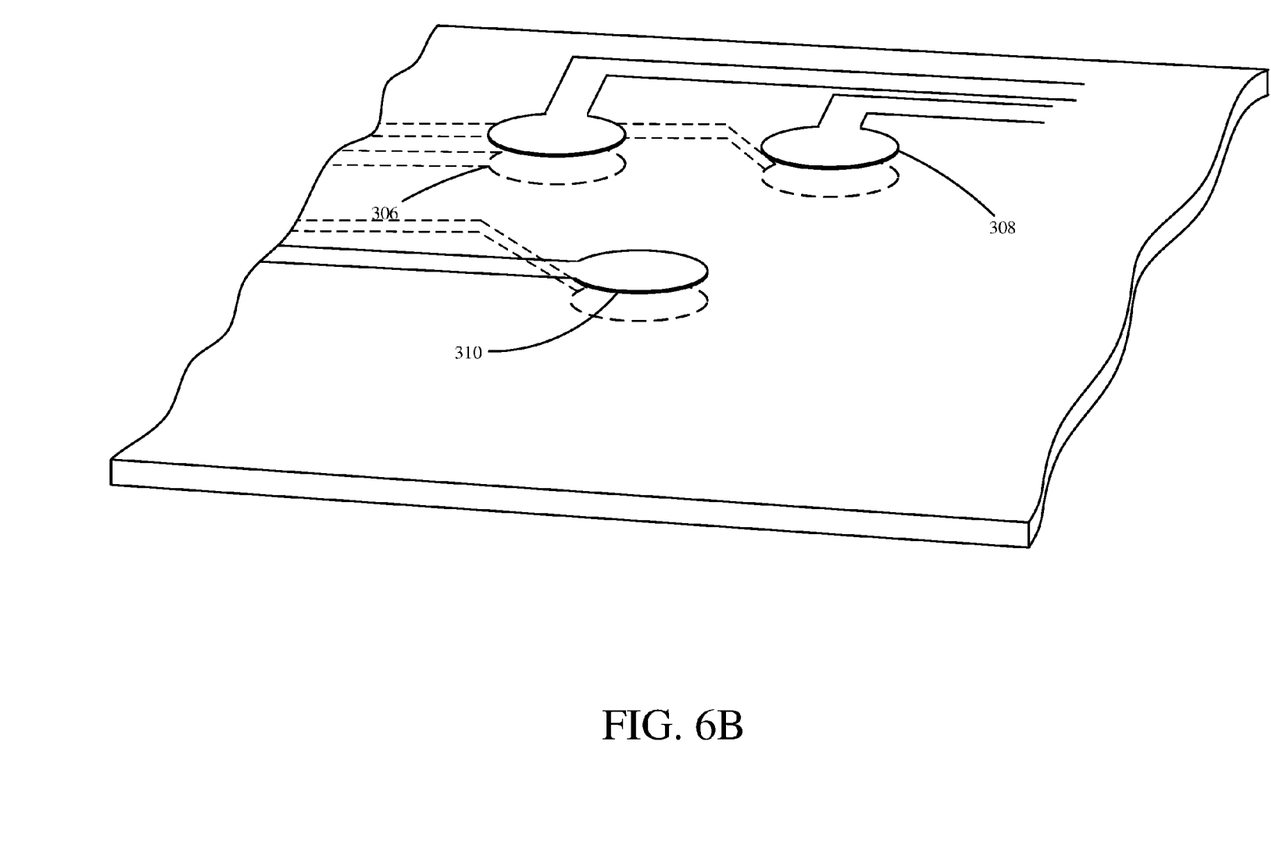
FIG. 6B is a diagrammatic view showing three distinct circuit board-based coupling capacitors formed for providing bi-directional communication in accordance with an embodiment of the present invention.

FIGS. 6A and 6B illustrate the construction and layout of three printed circuit board-based capacitors for coupling communication signals in an intrinsically-safe isolation manner in accordance with an embodiment of the present invention. As shown in FIGS. 6A and 6B, the capacitors are formed of the printed circuit board material itself. While the printed circuit board may be formed of any suitable printed circuit board materials, one particular example uses FR-4 printed circuit board material. FR-4 is a composite material composed of woven fiberglass cloth with an epoxy resin binder that is flame resistant.

The printed circuit board material has a first layer of copper 300 disposed on a first side, and a second layer of copper 302 disposed on a second side of insulation material 304. In the example shown in FIG. 6A, the copper layers are formed of finished 1 ounce copper. Insulation material 304 between the copper pads is used as a dielectric for the capacitor. In this way, capacitors are created on the printed circuit board by using the hard insulation 304 of the printed circuit board as the dielectric and placing copper pads on the opposite layers of material 304. The printed circuit board (dielectric) thickness must be 0.5 mm as required for intrinsic safety spacing for 60 volt peak level of protection category. In some intrinsic safety specifications, for example Annex F, the spacing may be reduced even further, such as to 0.2 mm. As shown in FIG. 6B, three capacitors are created using three sets of copper pads. The first two capacitors, 306, 308 are used for coupling the signal across the isolation barrier in either direction. The third capacitor 310 is for coupling the circuit commons to allow for an AC return path. Using the equation below and parameters, the capacitance of the capacitors can be calculated. It is estimated that a capacitance of 1.93 pF will be created by using 0.20 inch by 0.20 inch pads and a 0.5 mm printed circuit board dielectric thickness.

$$C = \frac{k\epsilon_0 A}{d}$$

Where:
k=4.3 (approximate for FR-4 board material)

$$\epsilon_0 = 8.854 * 10^{-12} \frac{F}{m}$$

A=area of copper pad
d=distance between pads.

Figure 7:
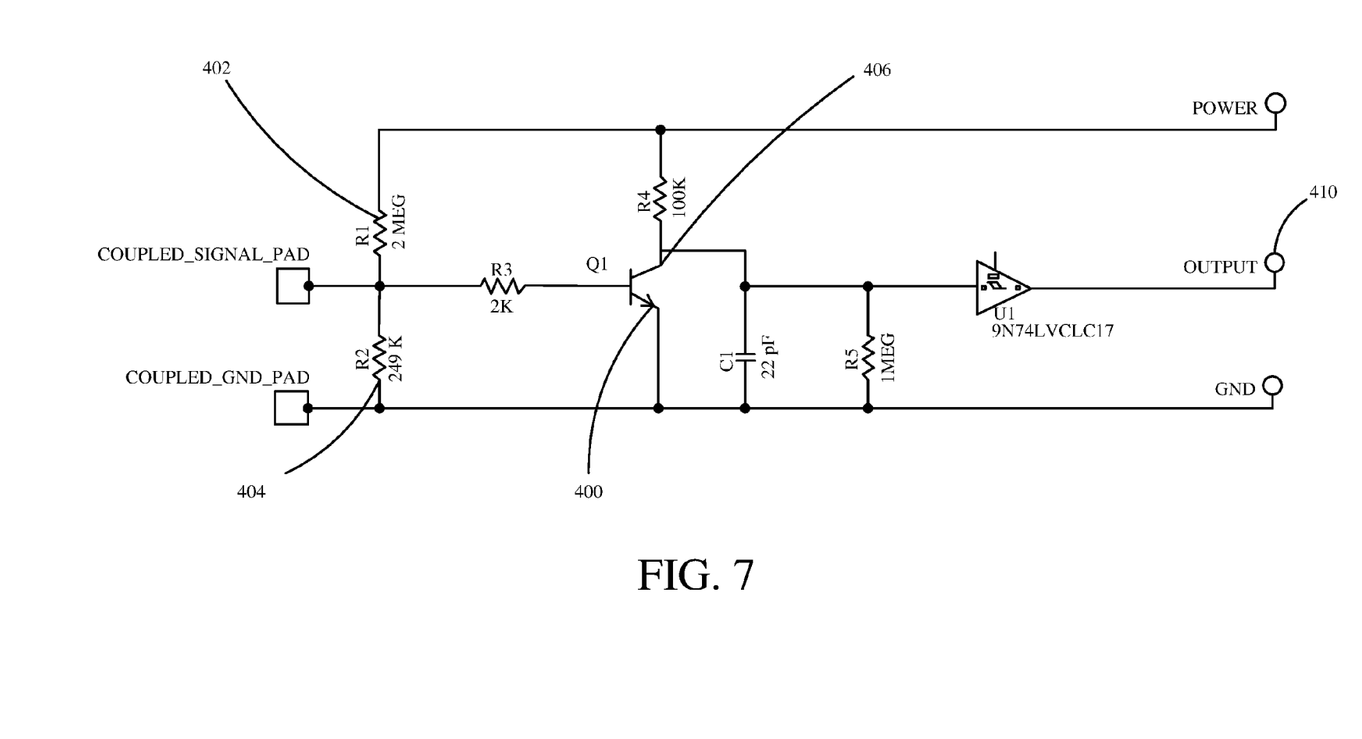
FIG. 7 is a circuit diagram of a demodulator circuit for demodulating the capacitively coupled signal to provide the original low-frequency communication signal, in accordance with an embodiment of the present invention.

Once the modulated signal is coupled across the printed circuit board-based capacitor, it needs to be demodulated and amplified. FIG. 7 is a circuit diagram of one exemplary circuit arrangement that can be used for such demodulation and amplification. Since the capacitance of the printed circuit board-based capacitor is very low, the demodulator requires a transistor with a very small base-emitter capacitance, such as that sold under the trade designation BFU550A RF transistor available from NXP Semiconductors Netherlands B.V. of Eindhoven, Netherlands. This transistor has an emitter capacitance $C_e$ of 0.98 pF. The printed circuit board-based capacitor and base-emitter capacitance of Q1 shown at reference numeral 400 form a voltage divider for the modulated signal. The larger the printed circuit board-based capacitor is with respect to the Q1 base-emitter capacitance, the larger the amplitude of the modulated signal is at the base of Q1, and the easier it is to demodulate. The AC input signal to the transistor Q1 is DC level shifted by resistors R1 and R2 (shown at reference numerals 402, 404, respectively). This level shifting is provided to optimally turn Q1 on and off. The output 406 of collector Q1 then drives a Schmitt trigger non-inverting buffer which adjusts the amplitude to the required level for the device's receive circuit. The output is provided at node 410 and will be the reproduced low-frequency communication signal 158 (shown in FIG. 2). While there may be a small time delay in the reproduced signal, it is insignificant relative to the timing of the message.

Figure 8:
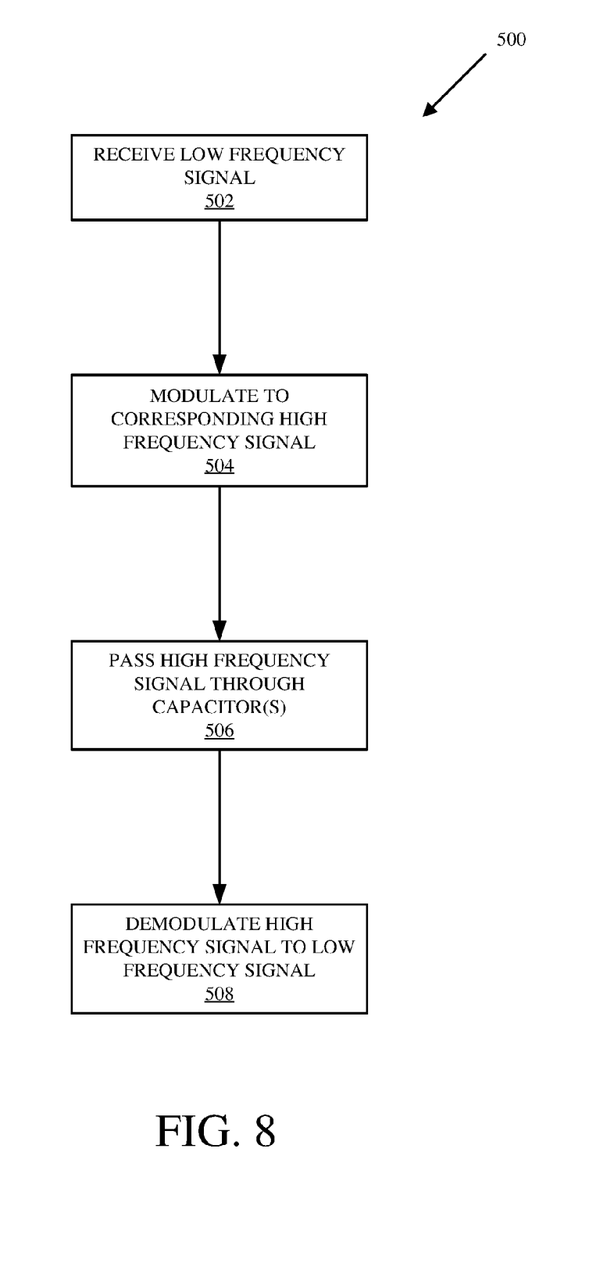
FIG. 8 is a flow diagram of a method of conveying a low-frequency communication signal across a circuit board-based capacitor in accordance with an embodiment of the present invention.

FIG. 8 is a flow diagram of a method of conveying a low-frequency communication signal across a printed circuit board-based capacitor while complying with intrinsic safety requirements in accordance with an embodiment of the present invention. Method 500 begins at block 502 where a relatively low-frequency communication signal is received. As set forth above, examples of low-frequency communication signals include those in the range of approximately 28 kHz. Next, at block 504, the low-frequency communication signal is modulated to a corresponding high-frequency communication signal. In one example, this modulation includes a modulated signal having a frequency that is approximately 15-20 times higher than the relatively low-frequency input signal. The modulated signal is then provided to and passed through one or more capacitors formed of the printed circuit board material itself, as indicated at block 506. As shown with respect to FIGS. 6A and 6B, the capacitors are generally provided using copper plates formed on opposite sides of the insulation material of the printed circuit board material where the insulation material is used as the dielectric for the capacitor. One example of a suitable printed circuit board material is that sold under the common trade designation FR4. Next, at block 508, the modulated signal is demodulated and recovered using a demodulator and suitable amplifier. In this way, signals can be transmitted or conveyed that are able to comply with intrinsic safety physical spacing requirements without using transformers or optoisolators.

Although the present invention has been described with reference to preferred embodiments, workers skilled in the art will recognize that changes may be made in form and detail without departing from the spirit and scope of the invention.

What is claimed is:

1. An apparatus comprising:
   a printed circuit board having a thickness that complies with an intrinsic safety physical separation specification;
   a first pair of capacitive plates disposed on opposite sides of the printed circuit board and arranged to form a first capacitor having an insulating layer of the printed circuit board forming a dielectric material for the first capacitor;
   a second pair of capacitive plates disposed on opposite sides of the printed circuit board and arranged to form a second capacitor having the insulating layer of the printed circuit board forming a dielectric material for the second capacitor;
   a modulator coupled to the first and second capacitors, the modulator being configured to receive an input signal having an input signal frequency and provide a modulated signal having a frequency that is higher than the input signal, wherein the modulator includes an oscillation circuit that is configured to oscillate when the input signal is in a low state; and
   a demodulator coupled to the first and second capacitors, the demodulator being configured to detect the modulated signal and provide a demodulated signal: having the input signal frequency.

2. The apparatus of claim 1, wherein the modulator is configured to provide the modulated signal having a frequency that is between 10 and 15 times greater than the input signal.

3. The apparatus of claim 1, wherein the first pair of capacitive plates each have a size of about 0.20 inches by 0.20 inches.

4. The apparatus of claim 1, wherein the first pair of capacitive plates each has an area of 0.04 square inches.

5. The apparatus of claim 1, wherein the printed circuit board has a thickness between about 0.2 mm and about 0.5 mm.

6. The apparatus of claim 1, wherein the first capacitor has a capacitance of about 2.0 pF.

7. The apparatus of claim 1, wherein the printed circuit board is formed of FR-4 printed circuit board material.

8. The apparatus of claim 1, wherein the oscillation circuit is a multi-vibrator.

9. The apparatus of claim 1, wherein the input signal has a frequency of about 28 kHz.

10. The apparatus of claim 1, wherein the demodulator includes a transistor that drives a Schmitt trigger buffer.

11. The apparatus of claim 10, wherein the demodulator has a transistor with an emitter capacitance of less than 1.0 ply.

12. The apparatus of claim 1, and further comprising a third pair of capacitive plates disposed on opposite sides of the printed circuit board and arranged to form a third capacitor having the insulating, layer of the printed circuit board forming a dielectric material for the third capacitor.

13. A method of conveying a communication signal across an isolation barrier, the method comprising:
   providing an input signal having an input signal frequency;
   modulating the input signal into a modulated signal having a modulation frequency that is higher than the input signal frequency, wherein the modulated signal includes oscillations at the modulation signal frequency only when the input signal is in a single state;
   capacitively coupling the modulated signal through an insulating layer of a printed circuit board providing the isolation harrier; and
   demodulating the modulated signal after the signal passes through the insulating layer of the printed circuit board.

14. The method of claim 13, wherein the input signal frequency is about 28 kHz.

15. The method of claim 13, wherein the communication across the isolation barrier is bidirectional communication.

16. The method of claim 13, wherein the single state is a low state.

* * * * *

UNITED STATES PATENT AND TRADEMARK OFFICE
CERTIFICATE OF CORRECTION

PATENT NO. : 9,990,837 B1  
APPLICATION NO. : 15/446459  
DATED : June 5, 2018  
INVENTOR(S) : Andrew L. Stone et al.

Page 1 of 1

It is certified that error appears in the above-identified patent and that said Letters Patent is hereby corrected as shown below:

Column 8,  
Claim 1, Line 20, remove ":"  
Claim 11, Lines 45-46, should read "less than 1.0 pF."  
Claim 12, Line 50, remove "," after the word "insulating"  
Claim 13, Line 63, change "harrier" to "barrier"

Signed and Sealed this  
Eleventh Day of September, 2018

Andrei Iancu  
*Director of the United States Patent and Trademark Office*